United States Patent
Gopalan et al.

(10) Patent No.: US 7,413,988 B1
(45) Date of Patent: Aug. 19, 2008

(54) METHOD AND APPARATUS FOR DETECTING PLANARIZATION OF METAL FILMS PRIOR TO CLEARING

(75) Inventors: Ramesh Gopalan, Fremont, CA (US); Sridharan Srivatsan, Fremont, CA (US); Katgenhalli Y. Ramanujam, Fremont, CA (US); Tom Ni, Pleasanton, CA (US); Conan Chiang, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 747 days.

(21) Appl. No.: 10/607,606

(22) Filed: Jun. 27, 2003

(51) Int. Cl.
*H01L 21/302* (2006.01)
(52) U.S. Cl. .................. 438/692; 438/13; 216/38; 216/88; 451/5
(58) Field of Classification Search ............... 438/1, 438/5, 7, 8, 10, 13, 14, 16, 17, 690–693; 216/38, 88–91; 451/1, 5, 6, 41
See application file for complete search history.

(56) References Cited

U.S. PATENT DOCUMENTS

| | | | | |
|---|---|---|---|---|
| 5,308,438 A * | 5/1994 | Cote et al. | ............ | 216/86 |
| 5,499,733 A * | 3/1996 | Litvak | ............ | 216/38 |
| 6,010,538 A * | 1/2000 | Sun et al. | ............ | 156/345.13 |
| 6,563,308 B2 * | 5/2003 | Nagano et al. | ............ | 324/230 |
| 6,602,724 B2 * | 8/2003 | Redeker et al. | ............ | 438/5 |

* cited by examiner

*Primary Examiner*—Shamim Ahmed
*Assistant Examiner*—Mahmoud Dahimene
(74) *Attorney, Agent, or Firm*—Martine Penilla & Gencarella, LLP (57) ABSTRACT

A method for planarizing a semiconductor substrate is provided. The method initiates with tracking a signal corresponding to a thickness of a conductive film disposed on the semiconductor substrate. Then, a second derivative is calculated from data representing the tracked signal. Next, the onset of planarization is identified based upon a change in the second derivative. A CMP system configured to identify a transition between stages of the CMP operation is also provided.

16 Claims, 9 Drawing Sheets

METHOD AND APPARATUS FOR DETECTING PLANARIZATION OF METAL FILMS PRIOR TO CLEARING

BACKGROUND OF THE INVENTION

The present invention relates to semiconductor processing and more specifically to a method and apparatus for detecting the onset of planarization during chemical mechanical planarization operations.

Figure 1A:
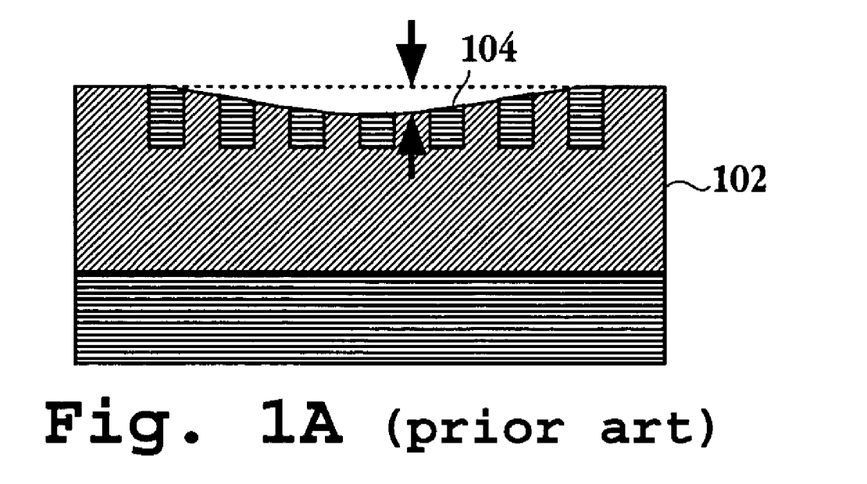
FIGS. 1A and 1B are exemplary schematic diagrams illustrating erosion and dishing, respectively.
Figure 1B:
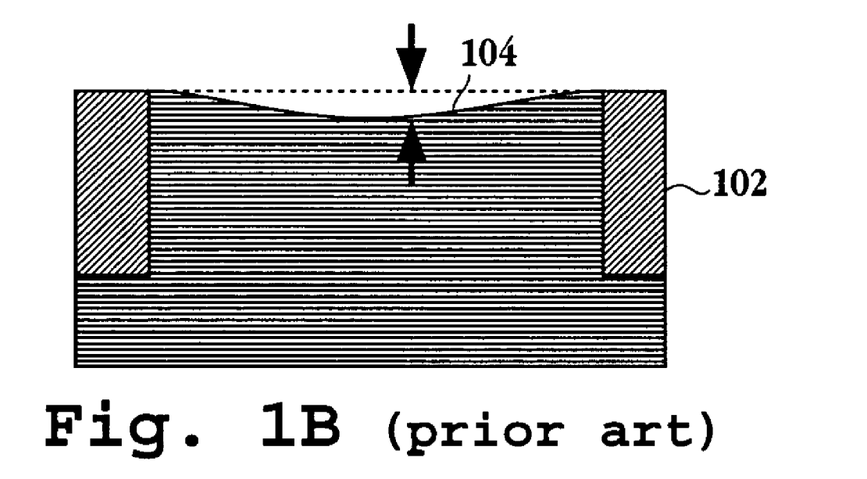

A challenge for chemical mechanical planarization processes, especially with respect to copper interconnects, is to remove the copper overburden without causing excessive dishing of copper in the trenches. Similarly, a typical requirement is to have minimal erosion and oxide loss in areas that cannot withstand aggressive chemical mechanical planarization (CMP) due to the density of fine copper trenches and vias in the underlying oxide or low-K dielectric layer. FIGS. 1A and 1B are exemplary schematic diagrams illustrating erosion and dishing, respectively. Dishing occurs when a top surface of a copper trench/via line 104 recedes below or protrudes above the level of adjacent dielectric 102, as illustrated in FIG. 1B. Erosion is a localized thinning of dielectric 102 as illustrated in FIG. 1A. Erosion of the dielectric occurs from over polishing, which is generally necessary to make sure that all the metal is removed from the top of the dielectric (otherwise lines may be shorted together). Dishing occurs on a soft metal, e.g., copper. Through dishing, the thickness of the copper interconnects 104 may be reduced which increases the electrical resistance. In addition, the overall changes in the planarity caused by dishing and erosion can also lead to challenges in obtaining good focus across the die during subsequent lithographic steps. However, for typical CMP processes, the approach generally taken is a one-size fits all approach. That is, the process to achieve a planarized copper top surface and the process from the planarized copper top surface to the clearance of the copper are treated under the same hardware, consumable and process conditions. One shortcoming with this approach is that the conditions for planarizing the copper overburden and the conditions for clearing a planarized layer are different. Thus, a single set of processing parameters, or consumables, may not be optimal for both of these stages of the CMP process.

In view of the foregoing, there is a need for a method and apparatus to provide a reliable signal indicating a point where processing conditions may be adjusted at or sometime after the onset of planarization.

SUMMARY OF THE INVENTION

Broadly speaking, the present invention fills these needs by identifying when a thin metal film disposed over a semiconductor substrate is planarized prior to clearance during a chemical mechanical planarization operation. It should be appreciated that the present invention can be implemented in numerous ways, including as an apparatus, a system, a device, or a method. Several inventive embodiments of the present invention are described below.

In one embodiment, a method for planarizing a semiconductor substrate is provided. The method initiates with tracking a signal corresponding to a thickness of a conductive film disposed on the semiconductor substrate. Then, a second derivative is calculated from data representing the tracked signal. Next, the onset of planarization is identified based upon a change in the second derivative.

In another embodiment, a method for determining when a substantially flat surface of a metal film has been achieved during a chemical mechanical planarization (CMP) operation is provided. The method initiates with monitoring a signal corresponding to an amount of metal within a detection region. Then, a rate of change over time of a removal rate is determined. Next, a threshold decrease in the rate of change is established. Next, a transition point is triggered when the rate of change crosses the threshold decrease in the rate of change.

In yet another embodiment, a system for planarizing a semiconductor substrate having a metal film disposed thereon is provided. The system includes a chemical mechanical planarization (CMP) unit. The CMP unit includes a polishing pad and a carrier. The carrier is configured to support the semiconductor substrate over the polishing pad. The carrier includes a sensor embedded therein. The sensor is configured to detect an amount of metal of the metal film within a detection region of the sensor. The system includes a controller in communication with the sensor. The controller is configured to convert a signal corresponding to the amount of metal of the metal film within the detection region of the sensor to a second derivative value of this original signal. The controller is further configured to track the second derivative value over time in order to identify a time point where the metal film is substantially flat.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE PREFERRED EMBODIMENTS

Several exemplary embodiments of the invention will now be described in detail with reference to the accompanying drawings. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention. FIGS. 1A and 1B are discussed above in the "Background of the Invention" section.

Figure 2A:
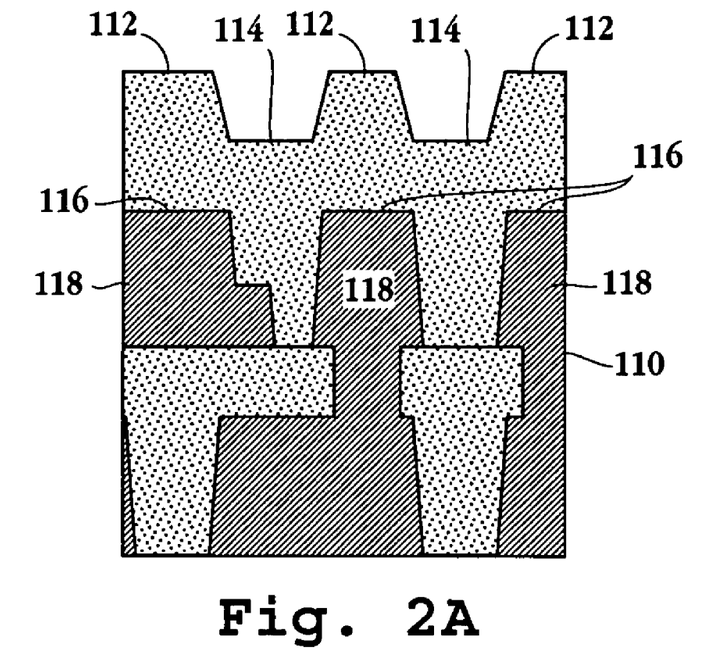
FIG. 2A is a simplified schematic cross-sectional diagram of a dual damascene structure after electroplating, but before chemical mechanical planarization in accordance with one embodiment of the invention.

FIG. 2A is a simplified schematic cross-sectional diagram of a dual damascene structure after electroplating, but before chemical mechanical planarization in accordance with one embodiment of the invention. Typically, the electroplating process, which deposits the copper on the wafer, leaves a layer with substantial topography on top of the wafer. As is generally known, the topography is created because of preferential deposition over some features relative to others. The copper deposition is usually conformal, but in areas where there are small and closely spaced features (of size one micrometer or less), there may be substantial super-fill on the copper surface after electroplating and before the CMP processing. Thus, substrate 110 results in peaks 112 and valleys 114 distributed across the topography of the substrate. It should be appreciated that the height of this initial topography, i.e., difference in level between peaks 112 and valleys 114 of the top surface, may be as much as half the typical copper thickness (which is about 0.7 micrometers on copper features having a thickness of 1–2 micrometers). The high areas of barrier layer 116, on top of oxide 118 may be considered to lie in the same plane, i.e., the height variations across the die (or wafer) are much less than 0.05 micrometers, typically. Thus, if it were possible to planarize a top surface of the copper, a second step would be the removal of a relatively flat uniform layer of copper everywhere across the die and wafer.

Figure 2B:
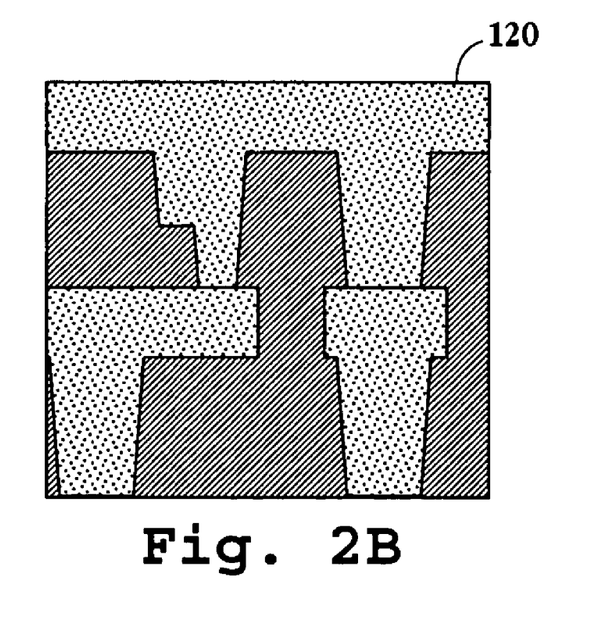
FIG. 2B is a simplified schematic cross-sectional diagram of FIG. 2A after planarization, where a uniform copper layer is left on top of the dielectric.

FIG. 2B is a simplified schematic cross-sectional diagram of FIG. 2A after planarization, where a uniform copper layer is left on top of the dielectric. Here, top surface 120 of the copper layer is relatively flat. Therefore, for the uniform removal of copper from a uniformly flat surface, the polishing pad is less important as the means for applying mechanical pressure and is more important as a means of facilitating the chemistry of the polish. That is, removing the passivation and reaction products is more important at this point. While CMP remains the only practical method to achieve planarization, the uniform removal of copper from an initially flat surface may also be accomplished by other technologies, such as electro polishing.

Figure 2C:
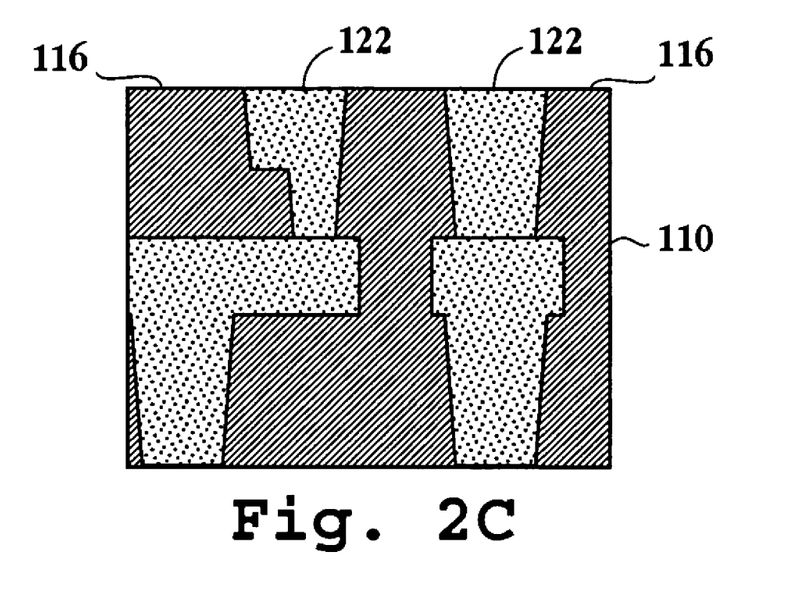
FIG. 2C is a simplified schematic diagram of a soft landing accomplished with the removal of the planarized copper layer of FIG. 2B.

FIG. 2C is a simplified schematic diagram of a soft landing accomplished with the removal of the planarized copper layer of FIG. 2B. It should be appreciated that the choice of consumables, i.e., polishing pad and slurry composition, has a substantial effect on the level of dishing, erosion, and oxide loss. However, for a given choice of consumables, the level of dishing, erosion, and oxide loss may be controlled by switching to a gentler polish scheme. That is, a lower down force and a lower belt speed are applied prior to the copper being cleared at any location of the wafer. This soft landing ensures minimal erosion and dishing when the copper is cleared and barrier oxide 116 is exposed. The dishing of copper in trenches 122 is substantially reduced through the soft landing. If the removal rate profile is adjusted to be uniform across wafer 110, then the amount of over polish (polish after copper has cleared at any location of the wafer) is also kept to a minimum. Typically, the ideal choice of process and consumables of the first stage, i.e., planarizing the copper top surface, are very different from the choices that are ideal for the second stage, i.e., the soft landing, which results in minimal dishing and erosion.

Accordingly, when a process (including slurry and pad compositions) is chosen for its high planarization efficiency, it will be useful to know when the planarization step is concluded. Therefore, after the wafer has been planarized, the process and consumable conditions (including the slurry composition and pad choice) may be switched so the subsequent polish of the uniform sheet of copper to the underlying barrier and oxide. Consequently, the choice of the process conditions appropriate for a uniform remaining sheet of copper enables minimization of dishing and erosion and oxide loss. In essence, the planarization process is decoupled from the process to obtain a soft landing. It should be appreciated that hard pads and slurries with higher abrasive concentration are typically used to remove copper overburden at the high areas much faster than in the low, recessed areas. Accordingly, the hard pads and slurries with higher abrasive concentrations have a higher planarization efficiency when compared to softer pads and slurries with little or not abrasive particles. Thus, the hard pads and slurries with higher abrasive concentration may be best suited for obtaining a planarized surface while slurries with less abrasive particles may be better suited for obtaining a soft landing. It should be appreciated that this is a general comment and is not meant to be restrictive. That is, the main point here is that the process conditions and the consumables may be different for the two stages of the CMP operation discussed herein.

Figure 3:
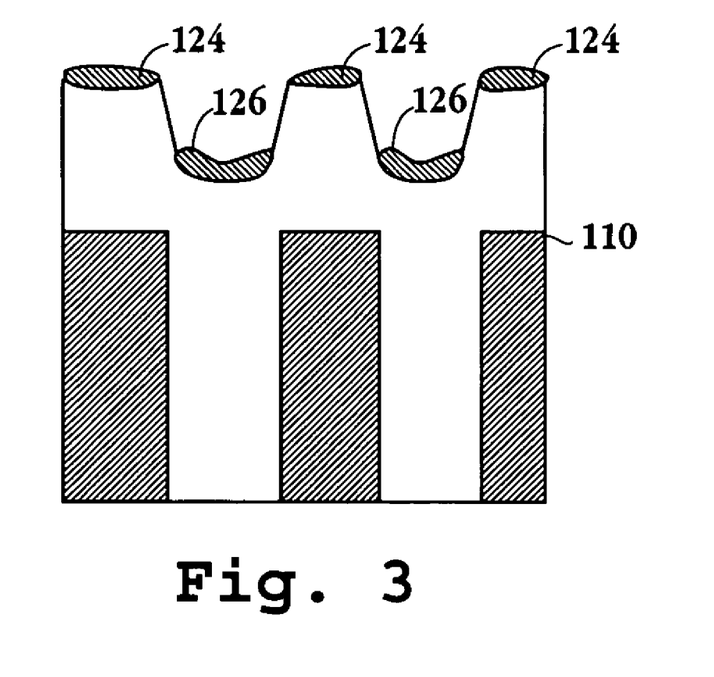
FIG. 3 is a simplified cross-sectional schematic diagram of a wafer illustrating the concentration of down force at the onset of a CMP process in accordance with one embodiment of the invention.

FIG. 3 is a simplified cross-sectional schematic diagram of a wafer illustrating the concentration of down force at the onset of a CMP process in accordance with one embodiment of the invention. When a CMP process begins on patterned wafer 110, the polish is concentrated on peaks 124 of the wafer topography where most of the down force is concentrated. Contrastingly, the removal rate applied to valleys 126 is associated with less down force relative to the down force applied to peaks 124. As is generally known, the removal rate is low at the start of the CMP process and then rises as the temperature of the polish environment increases, due to friction, and more slurry becomes effective through chemical activation. While most of the down force is concentrated on the peaks, the effective pressure on these higher areas does not compensate for the smaller lateral cross section of the high features, therefore, the total removal rate of copper at the start of the polish on the topography is relatively low.

Eddy current based probes have previously been used in applications to measure the thickness of thin metal films. As is generally known, eddy current sensors rely on an oscillating voltage signal (a frequency between about 1 kHz–100 MHz, depending on the application) fed to a probe coil and measure the shift in the coil impedance as conducting material is brought into the probe's proximity, also referred to as the probe's detection region. The probes may be placed in a wafer carrier, i.e., polishing head, that is behind the wafer. Here, the probe outputs a voltage which responds in a linear fashion to the conductive object, e.g., copper thickness in the wafer area being sensed. In one embodiment, about 1 cm of the wafer area is being sensed. It should be appreciated that this area may be referred to as a detection region. In one embodiment, the voltage signal from the eddy current sensor is transmitted across a rotating slip-ring assembly to the data gathering electronics of the system computer, i.e., controller.

Figure 4:
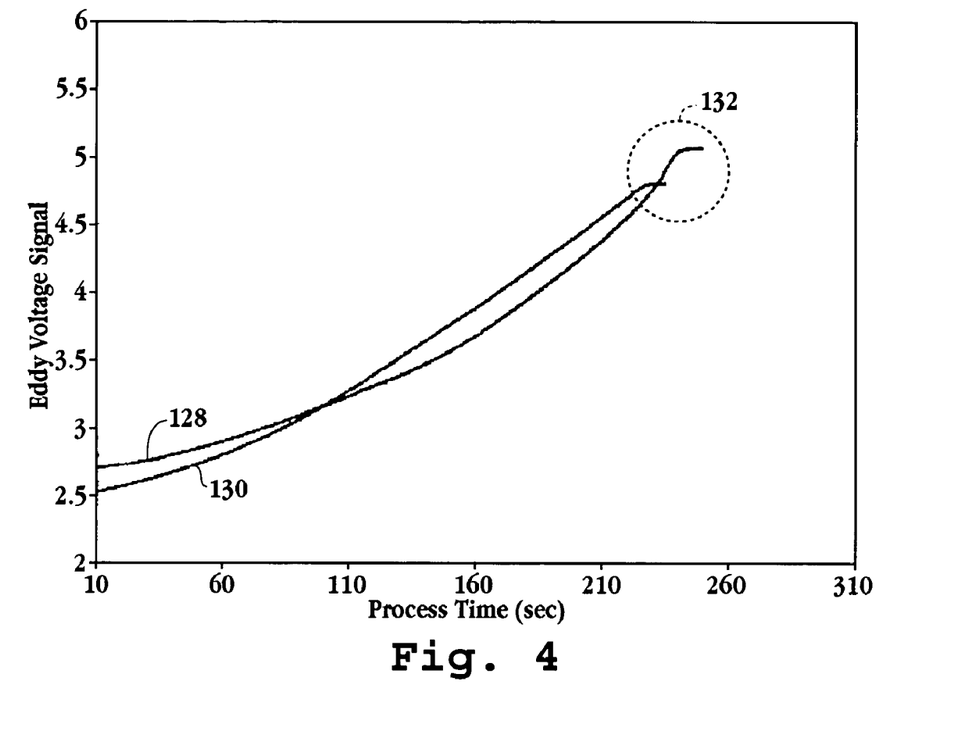
FIG. 4 is a graph illustrating a comparison of eddy probe responses associated with a CMP process of a patterned wafer and a CMP process of a blanket wafer.

FIG. 4 is a graph illustrating a comparison of eddy probe responses associated with a CMP process of a patterned wafer and a CMP process of a blanket wafer. Line 128 represents a trace of the eddy current signal associated with a patterned wafer, while line 130 represents a trace of the signal associated with a blanket wafer having a uniform layer of copper disposed over the substrate. For each wafer type the voltage initiates low with a lot of copper remaining, and increases as the copper layer is being removed. In one embodiment, a voltage increase of one volt corresponds with removal of a uniform layer of about 6200 Å. A clear indication that the removal of copper has stopped occurs when the voltage stops increasing. It should be appreciated that the rate of change, i.e., the slope, of this voltage with respect to time is a direct measure of the total copper removal rate in the area sensed by the probe. Thus, where the voltage on both the patterned and blanket wafers stops increasing is an indication that the area sensed by the probe is cleared of copper. As can be seen in region 132, the slope of the respective curves begins to flatten, thereby indicating clearance of the copper. The masked patterned wafer used here was a Sematech 831 Mask patterned wafer. Both the Masked patterned wafer and the blanket wafer had an initial copper thickness of about 14.5 kÅ.

Figure 5:
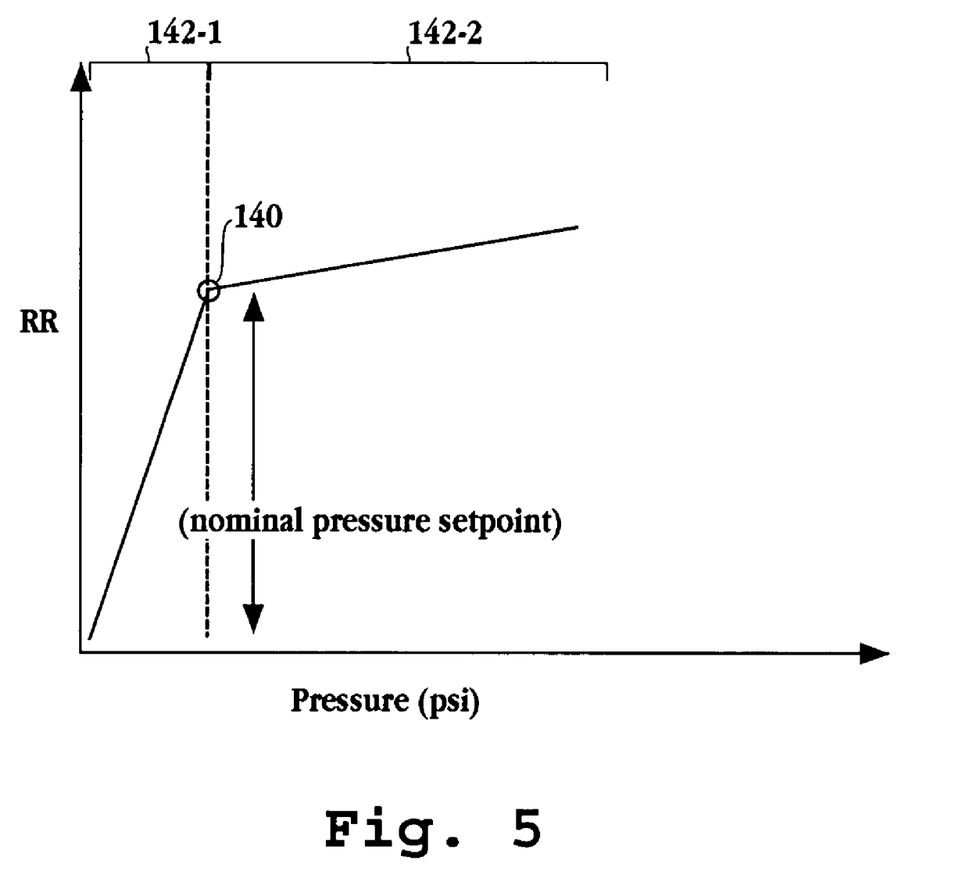
FIG. 5 is a graph illustrating the behavior of a typical copper CMP slurry represented by two regimes in accordance with one embodiment of the invention.

FIG. 5 is a graph illustrating the behavior of a typical copper CMP slurry represented by two regimes in accordance with one embodiment of the invention. Here, for a given slurry rate, the removal rate is not an exact linear response to the local pressure. Typically, the removal rate increases linearly at pressures above zero pounds per square inch (psi) reaching near maximum at pressure threshold value 140. After pressure threshold value 140 there is little or no further increase in removal rate with pressure increases above the threshold value, which is characteristic of the slurry composition and flow rate. In one embodiment, the nominal pressure recipe set point during bulk planarization and removal is typically set at or above the pressure associated with pressure threshold value 140, in order to maximize the removal and planarization rate during this first step of the wafer polish. The saturation of the removal rate at higher pressures occurs in a chemically-limited regime where there is not enough chemical action occurring to keep up with the increased mechanical action that becomes possible with the increased pressure. Additionally, the low areas (valleys) receive less fresh slurry supply due to the topography, which further suppresses the local removal rate in these areas. Therefore, when most, although not all, of the down force is concentrated on the high areas, increased removal at these high areas does not compensate adequately for the loss of removal at the low areas, i.e., recessed areas, or valleys, where the effective pressure is much lower. In Prestonian regime 142-1, the chemistry is not limiting the removal rate. Thus, the removal rate is approximately linear to the pressure. At higher pressures, as discussed above, the chemistry rates lag behind the mechanical abrasion and the removal rate begins to saturate. Thus, region 142-2 is a chemically limited saturation regime. It is preferable to operate a CMP process near pressure threshold 140, also referred to as threshold of the slurry response curve, which is where the chemical and physical effects of CMP are in lock-step. At pressure threshold 140, maximum advantage from both chemical and physical effects are ensured.

Figure 6A:
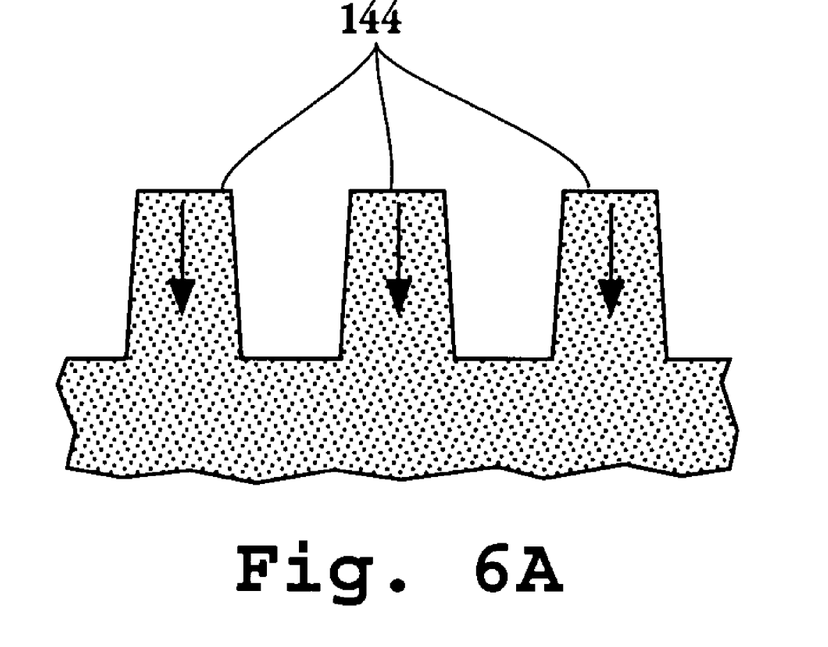
FIGS. 6A and 6B are simplified schematic diagrams representing the planarization of features to a uniform sheet, i.e., a substantially flat layer.
Figure 6B:
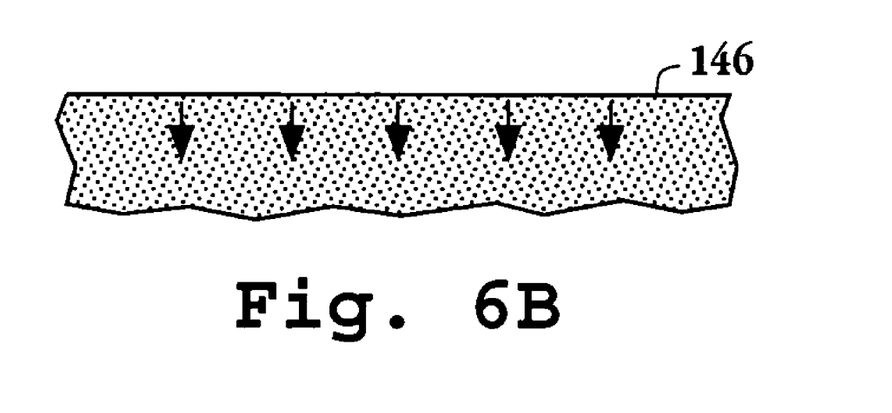

FIGS. 6A and 6B are simplified schematic diagrams representing the planarization of features to a uniform sheet, i.e., a substantially flat layer. FIG. 6A depicts features 144 prior to planarization. It should be appreciated that as the topography is polished down to larger total contact areas with the pad, the total removal rate increases. In turn, as the topography is planarized, as represented in FIG. 6B, top surface 146 becomes substantially flat. Thus, the total removal rate stabilizes and the time-slope reaches a stable value as the removal rate from a flat surface reaches a maximum steady-state value for the given process conditions. In one embodiment, where some topography features planarized faster than others on the same wafer die, the total removal rate of the metal increases to a higher stable value with the planarization of each set of features as discussed with reference to FIG. 7. Here, the maximum rate is reached when all the features have planarized and a uniform sheet of metal remains.

Figure 7:
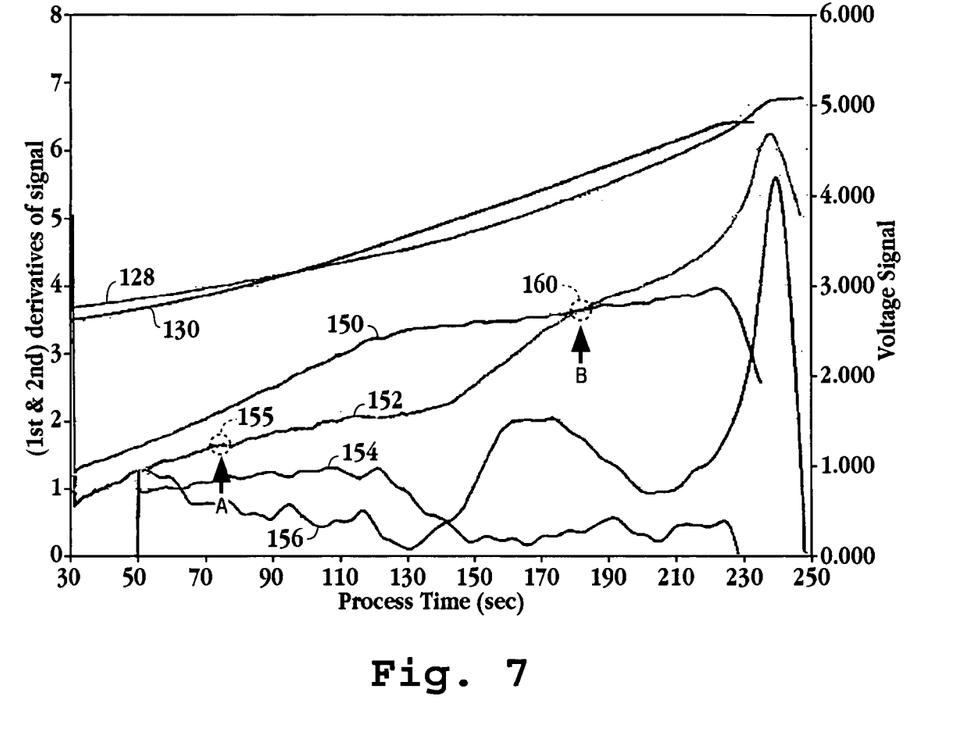
FIG. 7 depicts the slopes and second derivatives of the corresponding eddy probe voltage signal versus time of FIG. 4 in the case of both a patterned and blanket wafer in accordance with one embodiment of the invention.

FIG. 7 depicts the slopes and second derivatives of the corresponding eddy probe voltage signal versus time of FIG. 4 in the case of both a patterned and blanket wafer in accordance with one embodiment of the invention. It should be appreciated that the same process generating the data shown with reference to the graph of FIG. 4 is being illustrated in FIG. 7. Line 150 represents the slope of the blanket wafer, i.e., first derivative of line 130, and is a direct measure of the local Copper removal rate. Line 152 represents the slope of the patterned wafer, i.e., first derivative of line 128. As illustrated, the slope of the blanket wafer reaches a maximum earlier than on the patterned wafer. The removal rate on the patterned wafer appears to stabilize between process times of 90–140 seconds, before it starts to rise again, stabilizing near the maximum rate at between 170–190 seconds. It should be appreciated that the maximum rate of the patterned wafer illustrated by line 152 closely matches the rate on the blanket wafer (line 150) in vicinity 160 of time point B. Here, the minor difference are attributable to differences in the metal layer, e.g., copper plating quality, between the patterned and blanket wafers. It should be appreciated that the patterned wafer rate appears to stabilize before it reaches it final maximum due to the features of different sizes and densities in the patterned wafer.

In general, fine (narrow) lines (about <10 μm width) spaced close together are planarized faster than wide lines (>20 μm) having wide spaces in between. The time interval between about 90–140 seconds, represents a region, with respect to trace 152, where the fine lines have been planarized, while some of the wider lines remain relatively unpolished. The wider lines are planarized progressively in the time interval between about 140–170 seconds, at the end of which a planar sheet of copper or any other suitable metal, resembles the blanket wafer. It should be appreciated that the time point associated with point A 155 of trace 152 represents the beginning of the planarization of the finer features of the patterned wafer. Tests performed on mask wafers having 10 μm through 200 μm pitch 50% density lines indicate that the fine lines (10 μm) have planarized at time point A, while the wider lines (200 μm) do not become planarized until about time point B. In addition, the level of planarization has been further confirmed through profilometer scans at different time points.

Accordingly, at vicinity 160 of time point B in FIG. 7, the apparent removal rate on the blanket wafer equals the apparent removal rate on a patterned wafer. That is, by time point B, the patterned wafer approached plananrization as both the fine and the wide lines have been planarized. While, the patterned wafer slope does appear to continue to rise past time point B, the rate is at a much slower rate that is attributed to the final few structures which are being planarized. It should be appreciated that the chemical kinetics of the reactions proceeding on a planarized wafer take some time to equilibrate, thereby providing yet another reason as to why the rate of increase of the slope slows after Time B, but does not flatten.

Line 156 represents the rate of the slope increase (the second derivative) of line 152, for the patterned wafer. Thus, line 156 represents the rate of change of the rate of change for the voltage signal of line 128. Similarly, line 154 represents the rate of the slope increase (the second derivative) of line 150, based upon voltage signal trace 130 for the blanket wafer. As can be seen, at the time point associated with point B, the slope of line 156 begins to drop off indicating that planarization is concluding on the last remaining structures. This next-to-last, or penultimate drop in the second derivative of the eddy current voltage signal may be used to predict planarization completion in the CMP of a thin metal film, e.g., a copper film.

It should be appreciated that the sharp peak in the slope that occurs in lines 156 and 152 just before the endpoint is a phenomenon seen in the polish of patterned wafers and not on blanket wafers. This Pre-endpoint peak (PeP) is unrelated to planarization and is related to the presence of the copper lines and trenches in patterned wafers (which are absent in blanket wafers). The observed rise in the slope through this peak does not reflect a corresponding increase in the real copper removal rate and is not related to planarization. That is, the effect is a secondary effect unrelated to removal rate and corresponds to the interaction of the eddy currents with the interconnection lines when there is a thin layer of copper left.

It will be apparent to one skilled in the art that there are numerous approaches for the defining the achievement of planarization of the wafer with reference to the data supplied by FIG. 7. In one embodiment, the wafer may be assumed to be completely planarized (or very nearly so) when the first substantial drop is detected in the second derivative (line 156) of the slope after it has steadily increased since the start of the polish. As mentioned earlier an appropriate validation interval or threshold limit may be prescribed independently for the voltage (line 128), the slope (line 152), and the second derivative (line 156) in order to ensure that the correct conditions for planarization have been achieved. Product wafers usually have most of their copper topography within a specific range of features size and density. Therefore, in most practical applications, there will be one clear regime where the multiple conditions are met. The data used to generate the graph of FIG. 7 used the blanket wafer and the patterned wafer described above with reference to FIG. 4. The process conditions for the CMP process were 6 psi down force, 100 feet per minute (fpm) belt speed, and 300 ml/min of CABOT 5001 slurry being dispensed to the polishing pad. Additionally, a Standard Cast Madison polyurethane pad available from PRAXAIR, was used as the polishing pad. The eddy current sensor from which the voltage data was generated was located so as to detect an amount of metal or a metal thickness signal near the corresponding wafer center.

Figure 8:
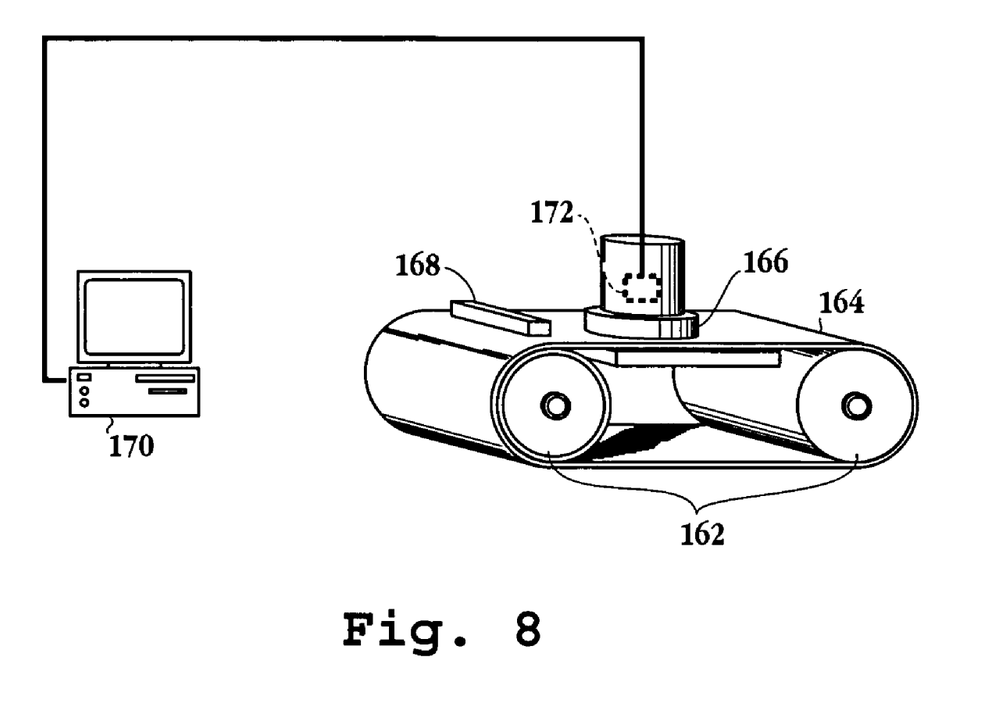
FIG. 8 is a simplified schematic diagram of a chemical mechanical planarization (CMP) system configured to planarize a semiconductor substrate in accordance with one embodiment of the invention.

FIG. 8 is a simplified schematic diagram of a chemical mechanical planarization (CMP) system configured to planarize a semiconductor substrate in accordance with one embodiment of the invention. The CMP system includes a CMP unit having polishing pad 164 driven by rotors 162. Wafer carrier 166 is configured to support a semiconductor substrate over pad 164 and apply a down force during the planarization operation. Wafer carrier 164 is also configured to rotate about its axis. Slurry dispenser 168 dispenses slurry to pad 164 during the planarization operation. Sensor 172 is embedded in wafer carrier 166. Sensor 172 is configured to provide a linear response to a change in the amount of metal detected in a detection region of the sensor. In one embodiment, sensor 172 may be an eddy current sensor. It should be appreciated that sensor 172 may be located in any suitable location and is not limited to being embedded in wafer carrier 164.

Still referring to FIG. 8, controller 170 is in communication with sensor 172. Controller 170 tracks the signal output from sensor 172 and is configured to calculate the slope and the second derivative of the tracked signal. Therefore, as a result of detecting a penultimate drop in the second derivative as discussed with reference to FIG. 7, controller 170 may automatically adjust the process and consumable parameters once the surface of the semiconductor substrate has been planarized and prior to clearance of the planarized metal layer. Alternatively, controller 170 may stop the planarization process in order to enable the changing of the process consumables, i.e., slurry and polishing pad, to process consumables better suited for the planarized surface in order to achieve a soft landing as discussed above. For example, the polishing pad may be switched to a another type of polishing pad and the slurry dispenser may be supplied with a slurry having different abrasion characteristics once planarization has been achieved through the detection of the drop of the second derivative as discussed with reference to FIG. 7. It should be appreciated that controller 170 may be a general purpose computer. In addition, a recipe for the CMP process may be entered into the general purpose computer through a suitable graphical user interface.

Figure 9:
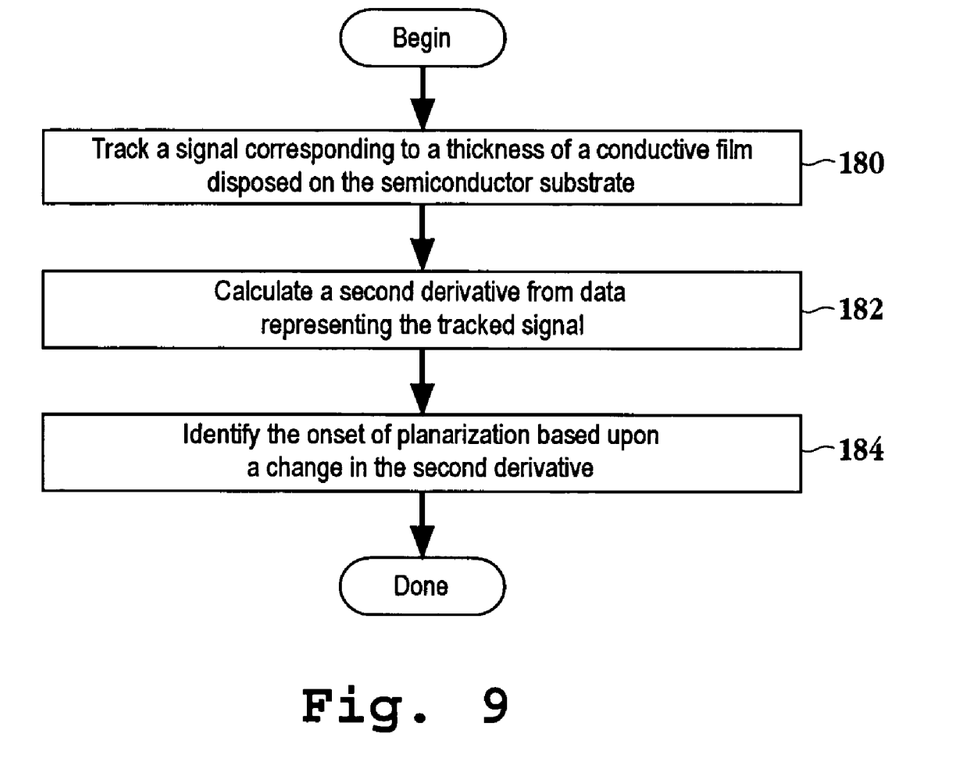
FIG. 9 is a flowchart diagram of the method operations for planarizing a semiconductor substrate in accordance with one embodiment of the invention.

FIG. 9 is a flowchart diagram of the method operations for planarizing a semiconductor substrate in accordance with one embodiment of the invention. The method initiates with operation 180, where a signal corresponding to the thickness of a conductive film disposed on a semiconductor substrate is tracked. Of course, the signal may correspond to an amount of metal within a detection region of a sensor. For example, an eddy current sensor provides a signal that is proportional to an amount of a conductive metal within the detection region prior to planarization. Once planarization is achieved, the signal is proportional to the thickness of the metal film. The method then advances to operation 182 where the second derivative is calculated from the data representing the tracked signal. As discussed with reference to FIG. 7, the slope of a trace of the tracked signal versus time, i.e., the first derivative, may also be calculated here. Then, the rate of change of the trace of the slope provides the basis for calculating the second derivative.

The method of FIG. 9 then proceeds to operation 184 where the onset of planarization is identified. Here, a drop in the value of the second derivative may be used to trigger the transition point to a planarized surface. As mentioned above with reference to FIG. 7, numerous criteria may be used to establish the identification of the drop in the second derivative, e.g., a drop after a certain threshold voltage is achieved, a drop of a certain degree, a drop after a certain removal rate identified by the first derivative, etc. It should be appreciated that once the onset of planarization has been identified, the processing parameters may be changed, or the process consumables may be changed, to optimize the process for the clearance of the planarized layer.

In summary, the above described invention provides a diagnostic tool for determining the onset of planarization or a planarization time point prior to clearance. This information may be used to trigger a change in process conditions or a change in process consumables in order to minimize erosion and dishing effects. That is, a soft landing is achieved through the ability to characterize the two stages of a CMP process. As discussed above, a signal generated by an eddy current sensor is traced over time. A second derivative of the trace is generated and used to identify a time period when the substrate surface is planarized. One skilled in the art will appreciate that while the embodiments described herein refer to a copper metal layer, i.e., dual damascene processes, where trenches and vias are etched into the silicon dioxide or low K material, any suitable metal layer disposed over a substrate where the metal layer is conductive may be used.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by one skilled in the art without departing from the scope of the present invention as defined by the following claims.

The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. A computer implemented method for planarizing a semiconductor substrate, comprising:
    tracking a voltage signal from an eddy current sensor corresponding to a thickness of a conductive film disposed on the semiconductor substrate;
    calculating a second derivative from data representing the tracked voltage signal; and
    identifying onset of planarization based upon a decrease in a value over time being monitored through the second derivative, the decrease occurring after an increase in the value.

2. The method of claim 1, wherein the method operation of tracking a voltage signal corresponding to a thickness of a film disposed on the semiconductor substrate includes,
    detecting the signal from a probe that provides a linear response to a remaining amount of the conductive film.

3. The method of claim 2, wherein the probe is an eddy current sensor and the conductive film is a copper film.

4. The method of claim 1, wherein the method operation of calculating a second derivative from data representing the tracked voltage signal includes,
    determining a second rate of change of a first rate of change, the first rate of change representing a slope associated with the tracked signal.

5. The method of claim 1, wherein the method operation of identifying onset of planarization includes,
    establishing a threshold signal level through which the decrease in the value must fall below.

6. The method of claim 1, wherein the method operation of identifying onset of planarization includes,
    establishing a drop level for the value of the second derivative; and
    monitoring the value of the second derivative; and
    once the value of the second derivative crosses the drop level, the method includes,
        adjusting planarization parameters associated with the planarizing operation.

7. The method of claim 1, further comprising:
    initiating a chemical mechanical planarization (CMP) operation under a first set of planarization parameters; and
    adjusting the CMP operation with a second set of planarization parameters after the onset of planarization.

8. The method of claim 7, wherein the method operation of adjusting the CMP operation with a second set of planarization parameters after the onset of planarization includes,
    decreasing both a down force applied to the semiconductor substrate and belt speed.

9. The method of claim 7, the first set of planarization parameters include a first slurry composition and the second set of planarization parameters includes a second slurry, the second slurry being less abrasive than the first slurry.

10. A method for determining when a substantially flat surface of a metal film has been achieved during a chemical mechanical planarization (CMP) operation, comprising:
    monitoring a voltage signal corresponding to an amount of metal within a detection region;
    determining a rate of change over time of a removal rate;
    establishing a threshold decrease associated with the rate of change; and
    triggering a transition point when the rate of change crosses the threshold decrease associated with the rate of change and after a period of time in which the rate of change increases, the transition point indicating an onset of planarization.

11. The method of claim 10, wherein the signal responds linearly to a change of an amount of metal within the detection region.

12. The method of claim 10, wherein the method operation of determining a rate of change over time of a removal rate includes,
    converting the voltage signal to a second derivative value of the voltage signal; and
    tracking the second derivative value of the voltage signal over time.

13. The method of claim 10, wherein in response to the method operation of triggering a transition point when the rate of change crosses the threshold decrease in the rate of change the method includes,
    adjusting processing parameters associated with the CMP operation.

14. The method of claim 13, wherein the processing parameters include one of a belt speed and a down force pressure applied to a substrate being processed.

15. The method of claim 10, wherein in response to the method operation of triggering a transition point when the rate of change crosses the threshold decrease in the rate of change the method includes,
    stopping the CMP operation; and
    changing a current polishing pad to a softer polishing pad.

16. The method of claim 15, further comprising:
    replacing a current slurry with a less abrasive slurry.

* * * * *